United States Patent
Jang et al.

(10) Patent No.: US 10,982,815 B2
(45) Date of Patent: Apr. 20, 2021

(54) LIGHTING DEVICE AND LED CIRCUIT BOARD WITH A CENTER OPENING WITH A PROTRUSION

(71) Applicant: LG INNOTEK CO., LTD., Seoul (KR)

(72) Inventors: Chul Ho Jang, Seoul (KR); Sun Ho Kim, Seoul (KR); Hwa Young Kim, Seoul (KR); Hui Jin Choe, Seoul (KR); Sang Hoon Park, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 288 days.

(21) Appl. No.: 16/095,050

(22) PCT Filed: Apr. 21, 2017

(86) PCT No.: PCT/KR2017/004275
§ 371 (c)(1),
(2) Date: Oct. 19, 2018

(87) PCT Pub. No.: WO2017/183938
PCT Pub. Date: Oct. 26, 2017

(65) Prior Publication Data
US 2020/0350300 A1    Nov. 5, 2020

(30) Foreign Application Priority Data

Apr. 21, 2016 (KR) .................. 10-2016-0048769
Jun. 22, 2016 (KR) .................. 10-2016-0078014

(51) Int. Cl.
*F21K 9/20* (2016.01)
*H05B 47/19* (2020.01)
(Continued)

(52) U.S. Cl.
CPC .............. *F21K 9/20* (2016.08); *F21V 19/003* (2013.01); *F21V 23/006* (2013.01);
(Continued)

(58) Field of Classification Search
CPC .. F21V 19/003; F21V 23/006; F21V 23/0435; H01L 25/167; H01L 33/62; F21Y 2103/33; F21Y 2105/18
See application file for complete search history.

(56) References Cited

U.S. PATENT DOCUMENTS

2010/0277926 A1* 11/2010 Wen .................. G02B 5/02
362/311.02
2010/0302758 A1* 12/2010 Wang ................ F21V 33/0076
362/20
(Continued)

FOREIGN PATENT DOCUMENTS

| KR | 10-2014-0108093 | 9/2014 |
| KR | 10-2015-0107245 | 9/2015 |
| WO | WO 2011/052943 | 5/2011 |
| WO | WO 2013/115439 | 8/2013 |
| WO | WO 2014/178595 | 11/2014 |

OTHER PUBLICATIONS

International Search Report (with English Translation) and Written Opinion dated Jul. 25, 2017 issued in Application No. PCT/KR2017/004275.

*Primary Examiner* — Rajarshi Chakraborty
*Assistant Examiner* — Michael Chiang
(74) *Attorney, Agent, or Firm* — KED & Associates LLP

(57) ABSTRACT

An embodiment provides a lighting device comprising: a body having a first opening at a central part thereof; a light source member, which is disposed on the body and includes a circuit board having a plurality of light-emitting elements arranged thereon; and a cover disposed on the light source member and coupled to the body, wherein the circuit board comprises at least one second opening vertically overlapping the first opening and at least one first protrusion protruding toward the inside of the second opening from a side surface of the second opening, and at least one of the light-emitting elements is mounted on the first protrusion.

8 Claims, 18 Drawing Sheets

(51) Int. Cl.

| | |
|---|---|
| *F21V 19/00* | (2006.01) |
| *F21V 23/00* | (2015.01) |
| *F21V 23/04* | (2006.01) |
| *H01L 25/16* | (2006.01) |
| *H01L 33/62* | (2010.01) |
| *F21Y 105/18* | (2016.01) |
| *F21Y 115/10* | (2016.01) |

(52) U.S. Cl.
CPC ........ *F21V 23/0435* (2013.01); *H01L 25/165* (2013.01); *H01L 25/167* (2013.01); *H01L 33/62* (2013.01); *H05B 47/19* (2020.01); *F21Y 2105/18* (2016.08); *F21Y 2115/10* (2016.08)

(56) References Cited

U.S. PATENT DOCUMENTS

| | | | |
|---|---|---|---|
| 2011/0109216 A1* | 5/2011 | Kang | F21K 9/23 313/45 |
| 2012/0057344 A1* | 3/2012 | Wang | F21V 29/74 362/235 |
| 2013/0200796 A1 | 8/2013 | Song et al. | |
| 2014/0043827 A1 | 2/2014 | Kim et al. | |
| 2014/0177224 A1* | 6/2014 | Tsai | F21K 9/23 362/249.01 |
| 2016/0169503 A1* | 6/2016 | Chen | F04D 25/088 416/5 |
| 2016/0323981 A1* | 11/2016 | Clark | F21V 23/04 |
| 2017/0077354 A1 | 3/2017 | Lee et al. | |

\* cited by examiner

LIGHTING DEVICE AND LED CIRCUIT BOARD WITH A CENTER OPENING WITH A PROTRUSION

CROSS-REFERENCE TO RELATED PATENT APPLICATIONS

This application is a U.S. National Stage Application under 35 U.S.C. § 371 of PCT Application No. PCT/KR2017/004275, filed Apr. 21, 2017, which claims priority to Korean Patent Application No. 10-2016-0048769, filed Apr. 21, 2016, and Korean Patent Application No. 10-2016-0078014, filed Jun. 22, 2016, whose entire disclosures are hereby incorporated by reference.

TECHNICAL FIELD

The present invention relates to a lighting device.

BACKGROUND ART

A light emitting diode (LED) is a kind of semiconductor element configured to convert electric energy into light. LEDs have advantages of low power consumption, semi-permanent lifetime, fast response speed, safety, and environmental friendliness compared to conventional light sources such as fluorescent lamps and incandescent lamps. Accordingly, studies for replacing the conventional light sources with LEDs are widely being conducted. Recently, the LEDs have been increasingly used as light sources for lighting devices such as various liquid crystal displays, electric sign boards, and street lamps used indoors and outdoors.

The lighting device using the LED as a light source includes a printed circuit board (PCB) on which the LED is mounted. However, the PCB is formed such that a central portion thereof is opened in order to fix the lighting device to a socket.

Accordingly, a central portion of a lighting device is darker than a peripheral portion, and thus a luminance uniformity of the lighting device is reduced.

DISCLOSURE

Technical Problem

The present light is directed to providing a lighting device with improved luminance uniformity.

Technical Solution

One aspect of the present invention provides a lighting device including a main body having a first opening in a central portion thereof; a light source member disposed on the main body and having a circuit board on which a plurality of light-emitting elements are disposed; and a cover disposed above the light source member and coupled to the main body, wherein the circuit board includes at least one second opening which vertically overlaps the first opening and one or more first protrusions which protrude from a side surface of the second opening toward an inside of the second opening, and at least one light-emitting element is mounted on the first protrusion.

Advantageous Effects

A luminance of a central portion of a lighting device of the present invention can increase and a luminance uniformity of the lighting device can be improved.

A variety of useful advantages and effects are not limited to the above-described contents and will be more easily understood when specific embodiments of the present invention are described.

MODES OF THE INVENTION

The embodiments of the present invention may be modified into different forms or the plurality of embodiments may be combined, and the scope of the present invention is not limited to the embodiments which will be described below.

Although a description given in a specific embodiment is not given in other embodiments, the description may be understood to be descriptions of the other embodiments as long as there are no opposing or inconsistent descriptions given.

For example, when a feature of an element A is described in a specific embodiment and a feature of an element B is described in another embodiment, the scope of the present invention includes an embodiment in which the elements A and B are combined even when the embodiment is not clearly described as long as there are no opposing or inconsistent descriptions given.

In a description of the embodiment, in a case in which any one element is described as being formed on (or under) another element, such a description includes both a case in which the two elements are formed to be in direct contact with each other and a case in which the two elements are in indirect contact with each other such that one or more other elements are interposed between the two elements. Furthermore, when in a case in which one element is described as being formed on (or under) the other element, such a description may include a case in which one element is formed at an upper side or a lower side with respect to the other element.

Hereinafter, the embodiments of the present invention will be described in detail with reference to the accompanying drawings so that those skilled in the art may easily perform the present invention.

Figure 1A:
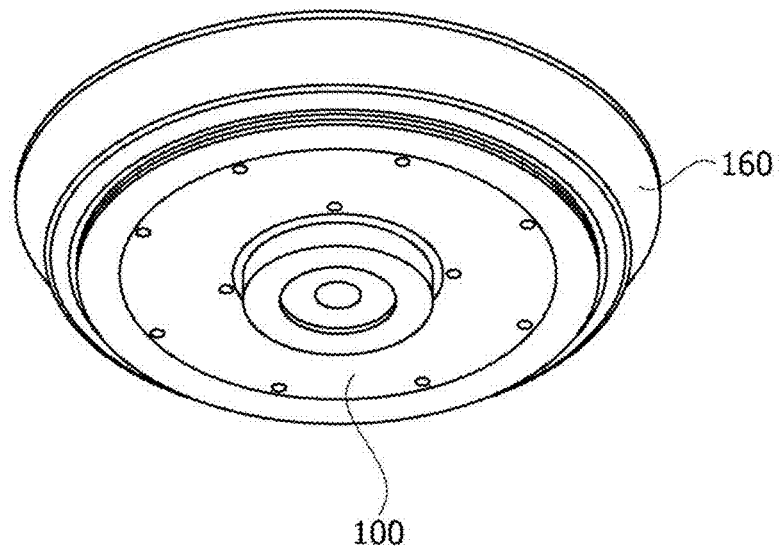
FIG. 1A is a perspective view illustrating a lower portion of a lighting device according to an embodiment of the present invention.
Figure 1B:
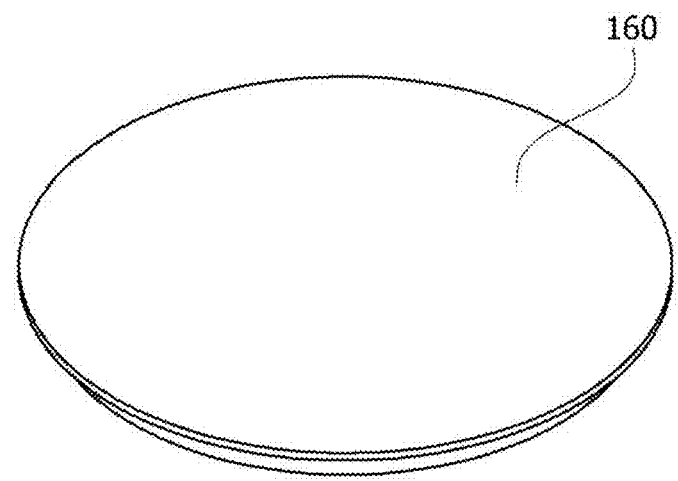
FIG. 1B is a perspective view illustrating an upper portion of the lighting device according to the embodiment of the present invention.
Figure 2A:
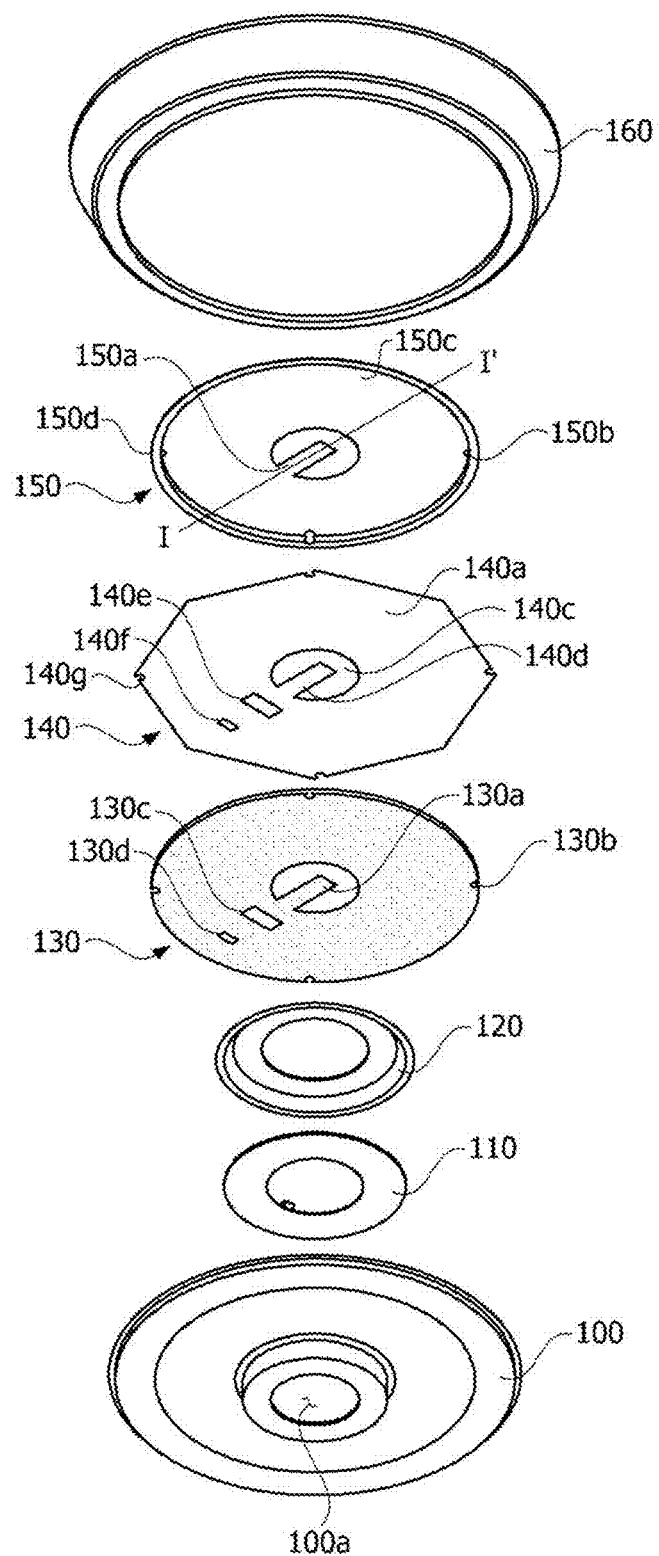
FIG. 2A is an exploded perspective view illustrating the lower portion of the lighting device according to the embodiment of the present invention.
Figure 2B:
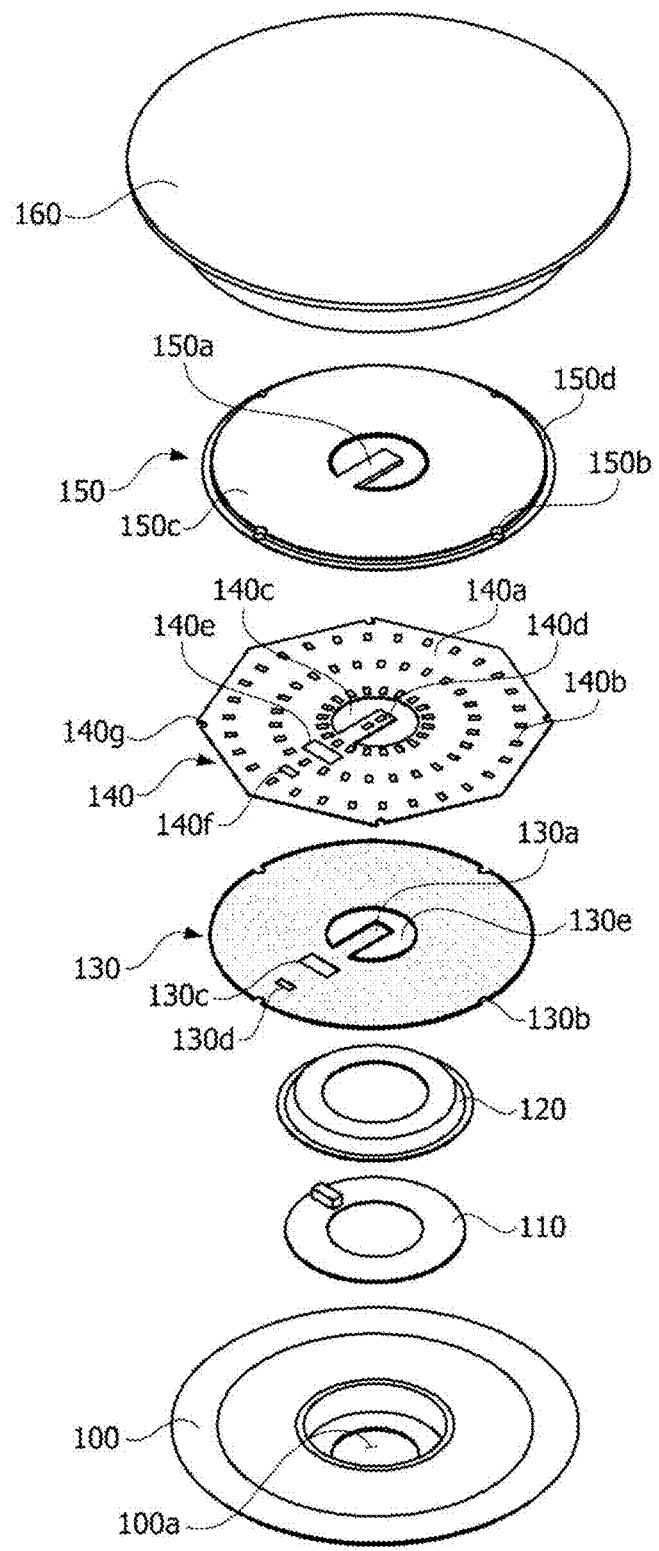
FIG. 2B is an exploded perspective view illustrating the upper portion of the lighting device according to the embodiment of the present invention.
Figure 2C:
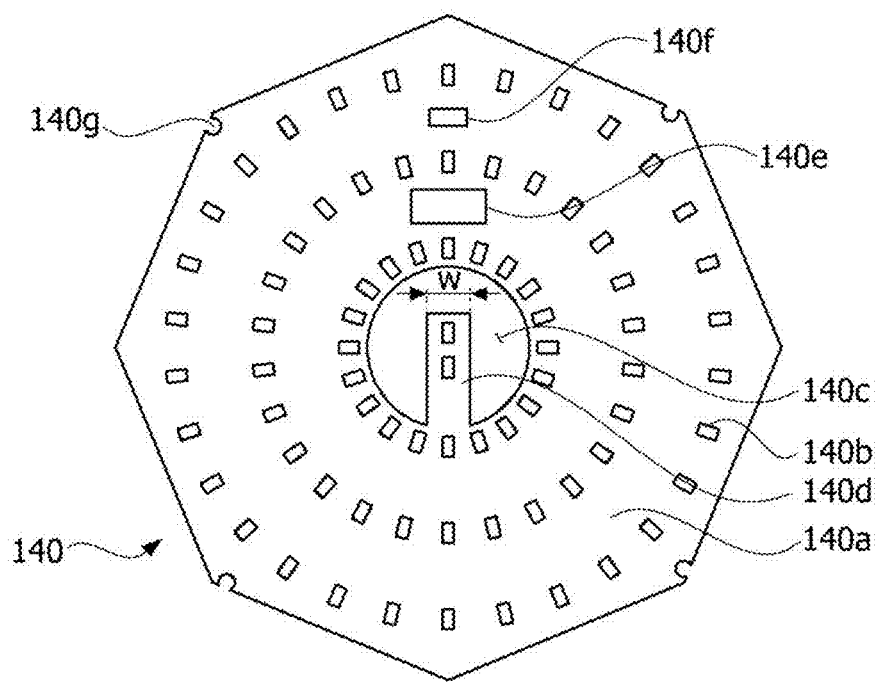
FIG. 2C is a plan view illustrating a light source member of FIG. 2B.
Figure 2D:
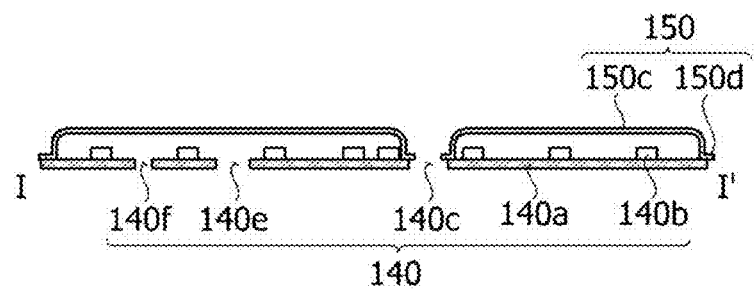
FIG. 2D is a cross-sectional view taken along line I-I' of FIG. 2A.

FIG. 1A is a perspective view illustrating a lower portion of a lighting device according to an embodiment of the present invention, and FIG. 1B is a perspective view illustrating an upper portion of the lighting device according to the embodiment of the present invention. FIG. 2A is an exploded perspective view illustrating the lower portion of the lighting device according to the embodiment of the present invention, and FIG. 2B is an exploded perspective view illustrating the upper portion of the lighting device according to the embodiment of the present invention. In addition, FIG. 2C is a plan view illustrating a light source member of FIG. 2B. In addition, FIG. 2D is a cross-sectional view taken along line I-I' of FIG. 2A, and only a third cover and the light source member are illustrated therein.

As illustrated in FIGS. 1A, 1B, 2A, 2B, 2C, and 2D, the lighting device according to the embodiment of the present invention is surrounded by a main body 100 and a first cover 160. Specifically, the lighting device according to the embodiment of the present includes the main body 100 having a first opening 100a at a central portion thereof, a light source member 140 disposed on the main body 100 and having a circuit board 140a on which a plurality of light-emitting elements 140b are mounted, and a first cover 160 disposed above the light source member 140 and coupled to the main body 100.

The circuit board 140a includes at least one second opening 140c overlapping the first opening 100a, and at least one light-emitting element 140b may be disposed on at least one first protrusion 140d protruding from a side surface of the second opening 140c toward an inside of the second opening 140c.

A rim of the main body 100 has a circular shape, and the main body 100 may have a ring shape having inner and outer circumferences. Here, a shape of the main body 100 may not be limited thereto, and may be an oval or polygonal shape.

The main body 100 may include the first opening 100a at the central portion, and a socket (not shown) may be disposed in the first opening 100a. The socket (not shown) may be physically connected to the main body 100 to be electrically and physically connected to the lighting device. The socket (not shown) is for providing a power source to the lighting device and also fixing the lighting device to a ceiling and the like.

The main body 100 may be formed of plastic, and formed through an injection molding process. For example, the main body 100 may be formed of polycarbonate (PC). When the main body 100 is formed of the plastic, the main body 100 may be lighter than a main body formed of metal, and the manufacturing cost thereof may be reduced. A material of the main body 100 is not limited thereto.

A driver 110 may be accommodated in the main body 100 and electrically connected to the socket (not shown) to drive the light-emitting element 140b. The driver 110 may be disposed to surround a peripheral of the first opening 100a. Although the driver 110 has a ring shape in the drawings like the main body 100, a shape of the driver 110 is not limited thereto.

The driver 110 may include a direct current (DC) converter configured to convert alternating current (AC) power provided by an external power source into DC power, driving chips configured to control driving of a light source, electro static discharge (ESD) protection devices for protecting the light source, a receiver for receiving external signals, and the like, but is not limited thereto. For example, the receiver may receive a signal of a remote controller when a user controls the remote controller to control brightness of the light source.

A second cover 120 configured to surround the driver 110 may be disposed on the main body 100. The second cover 120 may prevent electrical short-circuit between the driver 110 and the light source member 140. In addition, the second cover 120 may block heat generated by the light source member 140 from transmitting to the driver 110, and also protect the driver 110 from external matter and the like. The above-described second cover 120 may include a material having electrical insulating and heat-resisting properties. For example, the second cover 120 may be formed of plastic or PC. A material of the second cover 120 may be the same as that of the main body 100, bit is not limited thereto.

A supporting member 130, the light source member 140 including the circuit board 140a on which the plurality of light-emitting elements 140b are mounted, and a third cover 150 may be sequentially disposed above the main body 100.

The supporting member 130 is disposed above the main body 100 to cover the second cover 120. The above-described supporting member 130 may be interposed between the main body 100 and the light source member 140 to support the light source member 140.

The light source member 140 may include the circuit board 140a on which the plurality of light-emitting elements 140b are mounted. The circuit board 140a may have a structure in which a circuit pattern is formed on an insulator.

For example, the circuit board 140a may be selected from a printed circuit board (PCB), a metal core PCB, a flexible PCB, a ceramic PCB, and the like, but is not limited thereto. Particularly, the circuit board 140a may be coated with a material such as silver (Ag) or aluminum (Al), which reflects light, to reflect light emitted by the light-emitting element 140b, and the material is not limited thereto.

The circuit board 140a may have an oval, circular, or polygonal shape, but is not limited thereto. In the embodiment, the circuit board 140a having an edge in an octagonal shape is interposed between the supporting member 130 and the third cover 150. The circuit board 140a may be formed as a single board according to the embodiment, or have a structure in which two or more boards are formed and coupled.

The circuit board 140a includes at least one second opening 140c overlapping the first opening 100a of the main body 100, and one or more of the first protrusions 140d protruding from the side surface of the second opening 140c toward the inside of the second opening 140c. For example, in a case in which the circuit board 140a is formed as a single board, one circuit board 140a including the second opening 140c may be formed in a ring shape to be integrally formed with the first protrusion 140d. Here, at least one light-emitting element 140b may be mounted on the first protrusion 140d. The light-emitting element 140b mounted on the first protrusion 140d may improve a luminance of a central portion of the lighting device.

The light-emitting element 140b may be a light emitting diode (LED) configured to emit red, green, or blue light or an LED configured to emit ultraviolet light. In addition, the LED may be a lateral type, vertical type, or flip-chip type LED.

The light-emitting elements 140b are arranged in three rows in the drawings, but arrangements of the light-emitting elements 140b are not limited thereto, and may be easily changed.

Figure 3:
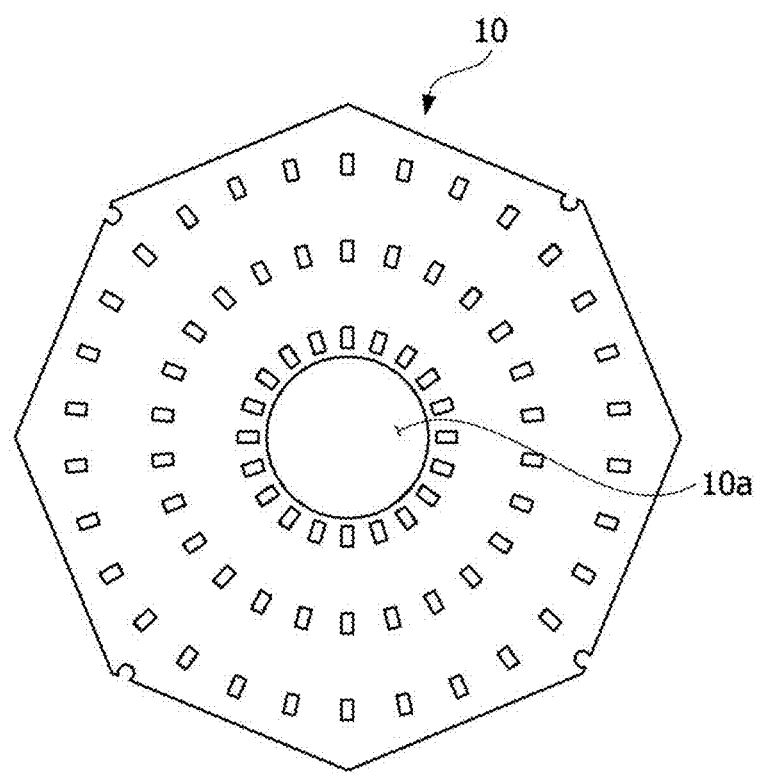
FIG. 3 is a plan view illustrating a general light source member.

FIG. 3 is a plan view illustrating a general light source member.

As illustrated in FIG. 3, a general light source member 10 may include a circuit board including an opening 10a at a central portion thereof. In addition, light-emitting elements may be mounted on the circuit board. A socket coupled to the opening 10a of a main body is exposed through the opening 10a formed at the central portion of the light source member 10 to be connected to a driver and the like. Accordingly, in a case in which the general light source member 10 is operated by the driver, a dart portion may be generated on the opening 10a of the circuit board at which a light source is not disposed.

However, referring to FIGS. 1A, 1B, 2A, 2B, 2C. and 2D, the light-emitting elements 140b according to the embodiment of the present invention are mounted on even the first protrusion 140d protruding from the second opening 140 formed in the central portion of the circuit board 140a of the light source member 140 toward the inside of the second opening 140c. Accordingly, when the light source member 140 is driven, since the plurality of light-emitting elements 140b mounted on a peripheral portion of the light source member 140, that is, the circuit board 140a, and at least one light-emitting element 140b mounted on the first protrusion 140d emits light, a dark portion is prevented from being formed at a central portion of the light source member 140, and a luminance uniformity of the central portion and the peripheral portion can be improved.

Specifically, the first protrusion 140d protrudes from the side surface of the second opening 140c toward an inside or the central portion of the circuit board 140a. Here, in a case in which a width W of the first protrusion 140d is so wide, an exposed region of the socket (not shown) exposed through the second opening 140c may be not be sufficient. Accordingly, it may be difficult to electrically and physically connect the socket and the lighting device. Accordingly, the maximum width W of the first protrusion 140d may be 30 mm. As a size of the light-emitting element 140b mounted on the first protrusion 140d decreases, the width W of the first protrusion 140d may decrease, but the width W is not limited thereto.

Figure 2E:
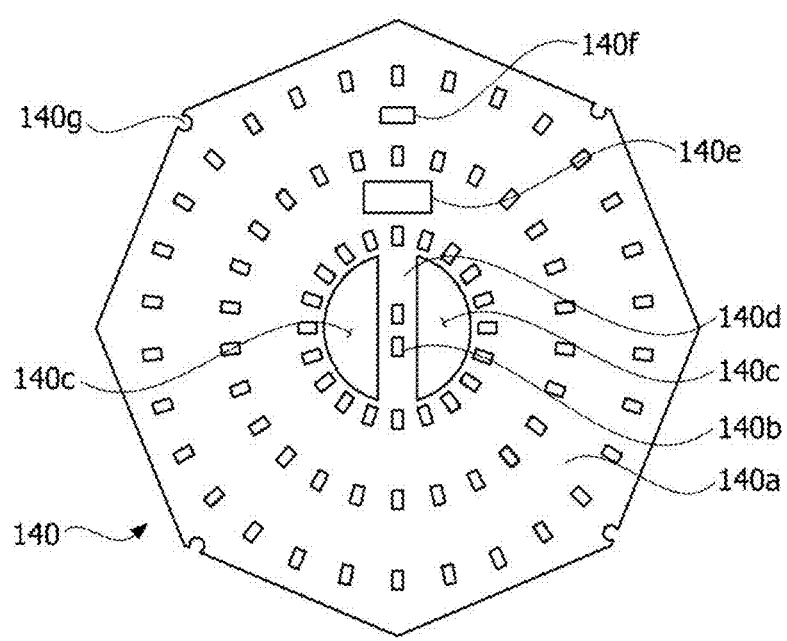
FIG. 2E is a plan view illustrating a light source member according to another embodiment of the present invention.

FIG. 2E is a plan view illustrating a light source member according to another embodiment of the present invention.

As illustrated in FIG. 2E, a first protrusion 140d may be formed in a second opening 140c of a circuit board. Here, the first protrusion 140d may extend from one side surface of the second opening 140c of a circuit board 140a to the other side surface of the second opening 140c of the circuit board 140a. For example, the first protrusion 140d may be formed by connecting two facing side surfaces of the second opening 140c. A shape of the first protrusion 140d may be a straight line shape when seen from above, but is not limited thereto, and may also be a curved line shape.

In addition, the first protrusion 140d may also be formed by interposing a separate circuit board between the second opening 140c of the circuit board 140a without being formed by extending from the circuit board 140a, but is not limited thereto.

Meanwhile, referring to FIGS. 1A, 1B, 2A, 2B, 2C, and 2D, the lighting device according to the embodiment of the present invention may further include the supporting member 130 interposed between the light source member 140 and the main body 100, and the third cover 150 disposed on the light source member 140.

Here, each of the supporting member 130 and the third cover 150 may include an opening passing through a central portion thereof to expose the second opening 140c of the light source member 140. In addition, the supporting member 130 disposed under the light source member 140 may include a third protrusion 130a protruding to correspond to the first protrusion 140d of the light source member 140. In addition, the third cover 150 disposed on the light source member 140 may also include second protrusions 130a and 150a protruding to correspond to the first protrusion 140d of the light source member 140.

The supporting member 130 may be disposed to support a lower surface of the light source member 140, and surround the driver 110 accommodated in the main body 100. An edge of the supporting member 130 may be formed to be bent in an upward direction in which the first cover 160 is disposed to form a space, in which the light source member 140 may be accommodated, in the supporting member 130. Here, because an edge of the third protrusion 130a of the supporting member 130 is formed to be also bent in an upward direction in which the first cover 160 is disposed, the first protrusion 140d of the light source member 140 may also be accommodated in the third protrusion 130a of the supporting member 130.

Because the supporting member 130 is formed of a material such as aluminum (Al), copper (Cu), silver (Ag), and gold (Au) having high thermal conductivity to radiate heat generated while the light source member 140 is driven, the supporting member 130 may serve as a heat sink, but is not limited thereto.

The third cover 150 is for diffusing light emitted by the light source member 140. Because the third cover 150 is formed of a transparent resin and the like, the third cover 150 may diffuse light emitted by the light source member 140. The third cover 150 may be disposed on the light source member 140 to surround the light-emitting elements 140*b*. A shape of a rim of the third cover 150 may be a circular shape corresponding to a shape of the first cover 160, but is not limited thereto, and may be an oval or polygonal shape.

The third cover 150 may change a path of light emitted by the light-emitting element 140*b* mounted on the circuit board 140*a* and a path of light emitted by the light-emitting element 140*b* mounted on the first protrusion 140*d*. For example, the third cover 150 may diffuse light emitted by the light-emitting element 140*b* mounted on the circuit board 140*a* and light emitted by the light-emitting element 140*b* mounted on the first protrusion 140*d*, but is not limited thereto. For example, the third cover 150 may also have a lens structure illustrated in FIGS. 13 to 17.

The third cover 150 may include a light transmitter 150*c* configured to transmit or diffuse light emitted by the light-emitting element 140*b* and a fixing portion 150*d* for disposing the third cover 150 on the circuit board 140*a*.

The third cover 150 may be convex in an upward direction in which the first cover 160 is disposed, or a part of an upper surface of the third cover 150 may have a flat shape. Accordingly, the third cover 150 may be disposed to cover the light-emitting elements 140*b* mounted on the circuit board 140*a*, and a shape of the third cover 150 is not limited thereto. For example, a part of the upper surface of the light transmitter 150*c* is convex or concave, and an irregular pattern may also be further formed thereon.

In addition, the fixing portion 150*d* of the third cover 150 may protrude outward from the third cover 150 to be in contact with an edge of the upper surface of the circuit board 140*a*. In the embodiment, a part of the fixing portion 150*d* of the third cover 150 protrudes further outward than the circuit board 140*a*. A shape of an edge of the third cover 150 is not limited thereto. In addition, in the embodiment, the third cover 150 is illustrated as one main body, but may have a structure in which two or more bodies are coupled, and is not limited thereto.

The third cover 150 and the supporting member 130 may be coupled such that the light source member 140 is installed there between. A shape of the edge of the supporting member 130 may be the same as that of the third cover 150, but is not limited thereto.

A first coupling portion 150*b* is formed on a part of the third cover 150, and for example, the first coupling portion 150*b* may be formed in an interface region between the light transmitter 150*c* and the fixing portion 150*d*. Specifically, a groove may be formed in the interface region between the light transmitter 150*c* and the fixing portion 150*d* in an inward direction of the light transmitter 150*c*. In addition, a second coupling portion 130*b* may be formed at the edge of the supporting member 130. A third coupling portion 140*g* may also be concavely formed at the edge of the circuit board 140*a* in an inward direction of the circuit board 140*a*, and although not illustrated in the drawings, coupling members such as screws may be inserted into the first, second, and third coupling portions 150*b*, 130*b*, and 140*g* from an upper portion of the first cover 160.

In the embodiment, the second coupling portion 130*b* and the third coupling portion 140*g* are respectively concavely formed in inward directions of the supporting member 130 and the circuit board 140*a*, and the first coupling portion 150*b* is formed in a groove shape in a part of the interface region between the light transmitter 150*c* and the fixing portion 150*d*, but are not limited thereto, and may have various shapes. For example, the first coupling portion 150*b* may extend outward from one region of the fixing portion 150*d*, the second coupling portion 130*b* and the third coupling portion 140*g* may respectively protrude in outward directions of the supporting member 130 and the circuit board 140*a*, and the first coupling portion 150*b*, the second coupling portion 130*b*, and the third coupling portion 140*g* may be coupled by coupling members.

The circuit board 140*a* of the light source member 140 according to the embodiment of the present invention may further include a third opening 140*e* and a fourth opening 140*f*. For example, the third opening 140*e* may be an opening for exposing the above-described receiver of the driver 110.

In a case in which the receiver is disposed under the circuit board 140*a*, it is difficult for the receiver to wirelessly receive an external signal. Accordingly, the circuit board 140*a* according to the embodiment of the present invention may further include the third opening 140*e* for exposing the receiver. In addition, the fourth opening 140*e* may be an opening for connecting the driver 110 and the circuit board 140*a*.

To this end, openings 130*c* and 130*d* may be also be formed at regions, which correspond to the third opening 140*e* and the fourth opening 140*f*, in the supporting member 130 disposed under the light source member 140. For example, in a case in which the circuit board 140*a* is connected to the driver 110 through a wire or the like, the wire may be inserted into the opening 130*d* of the supporting member 130 and the fourth opening 140*e* and the circuit board 140*a* to electrically connect the driver 110 to the light source member 140.

In addition, the first cover 160 may be coupled to the main body 100 to surround the third cover 150, and thus form an exterior of the lighting device. That is, the driver 110, the second cover 120, the supporting member 130, the light source member 140, and the third cover 150 may be interposed between the first cover 160 and the main body 100.

As described above, the lighting device according to the embodiment of the present invention has a structure in which openings are formed in the regions, which correspond to the first opening 100*a* of the main body 100, of the supporting member 130, the light source member 140, and the third cover 150 sequentially disposed above the main body 100, and pass through the central portions thereof. Accordingly, a user may electrically and physically connect the socket (not shown) exposed through the openings formed in the central portions of the lighting device supporting member 130, the light source member 140 and the third cover 150 to the lighting device.

Figure 4:
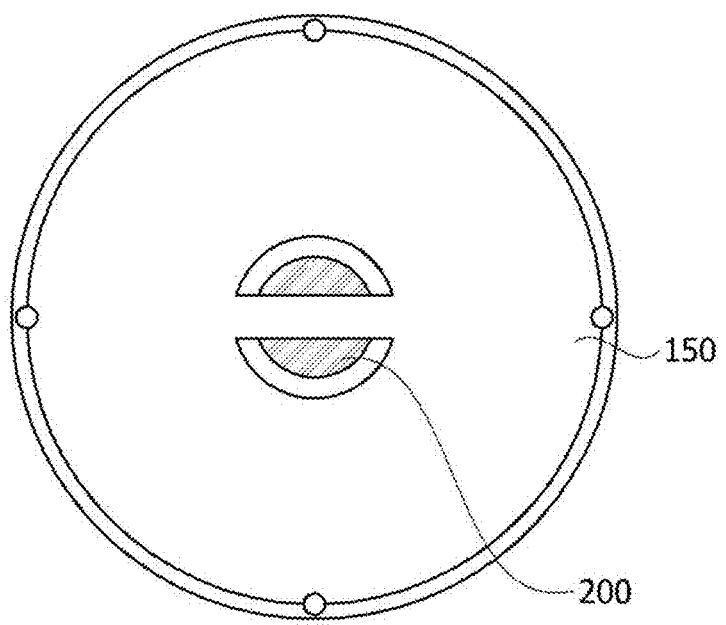
FIG. 4 is a plan view illustrating the arrangement of a socket for installing the lighting device on a ceiling and a third cover of FIG. 2A.

FIG. 4 is a plan view illustrating the arrangement of the socket for installing the lighting device on a ceiling and the third cover of FIG. 2A.

Generally, a wire for connecting a socket 200 protrudes from a ceiling. The user may install the socket 200 on the ceiling, and couple the socket 200 to the lighting device. The lighting device may be electrically and physically connected to the socket 200 in a state in which the main body 100 (see FIG. 2A), the driver 110 (see FIG. 2A), the second cover 120 (see FIG. 2A), the supporting member 130 (see FIG. 2A), the light source member 140 (see FIG. 2A), and the third cover 150 are coupled. A part of the socket 200 may be exposed through the opening, which is formed to correspond to the second opening 140*c* of the light source member 140 (see FIG. 2A), of the third cover 150, and as illustrated in FIG. 4, the user may electrically and physically connect the socket 200 exposed through the opening of the third cover 150 to the lighting device.

Accordingly, according to the embodiment of the present invention, even when the first protrusion 140d is formed in the second opening 140c of the circuit board 140a of the light source member 140, a space wide enough to connect the socket 200 to the lighting device through the second opening 140c may be secured. Accordingly, the lighting device according to the embodiment of the present invention may be used with a conventional socket 200 and a conventional main body 100.

Meanwhile, in a lighting device according to another embodiment of the present invention, a light source member 140 may include first and second circuit boards.

Figure 5:
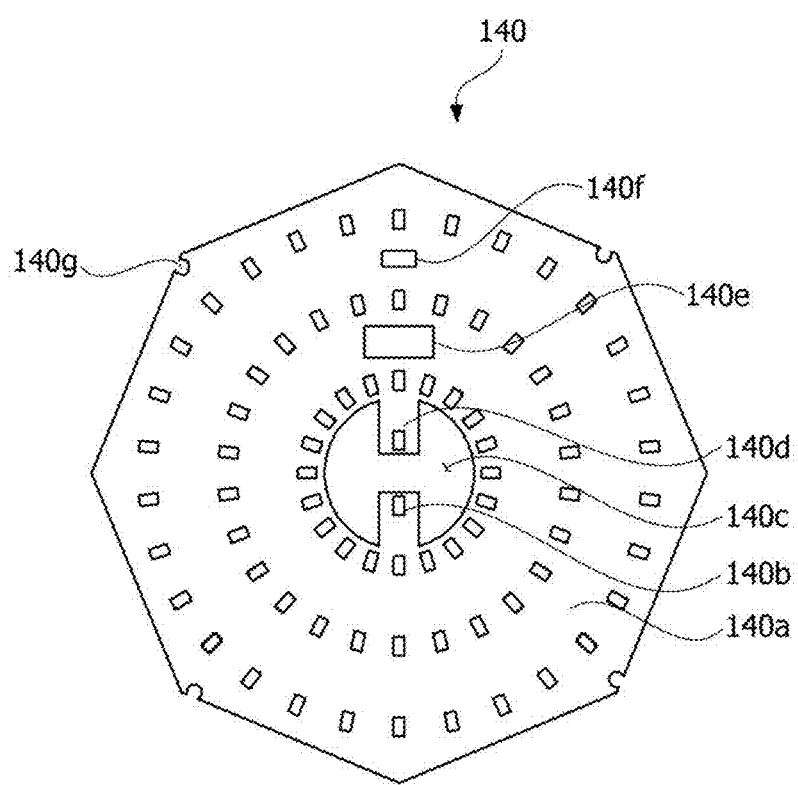
FIG. 5 is a plan view illustrating a light source member according to still another embodiment of the present invention.

FIG. 5 is a plan view illustrating a light source member according to still another embodiment of the present invention.

As illustrated in FIG. 5, in a light source member 140 according to still another embodiment of the present invention, at least two first protrusions 140d protrude from a side surface of a second opening 140c toward an inside or a central portion of a circuit board 140a. In the embodiment, two first protrusions 140d are illustrated. Here, two first protrusions 140d may protrude from the side surface of the second opening 140c toward the inside or the central portion of the circuit board 140a such that the two first protrusions 140d face each other, but are not limited thereto.

Figure 6A:
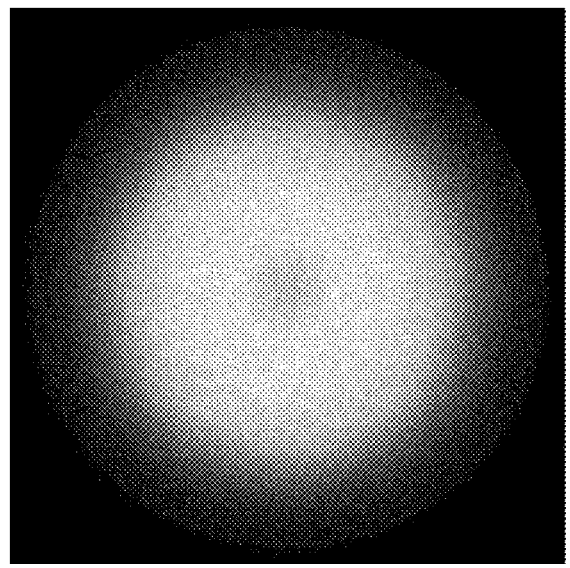
FIG. 6A is a light-emitting image of a general lighting device.
Figure 6B:
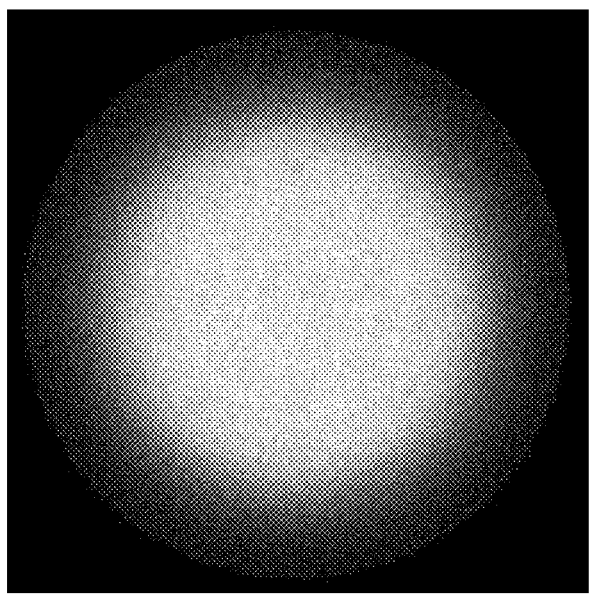
FIG. 6B is a light-emitting image of the lighting device according to the embodiment of the present invention.

FIG. 6A is a light-emitting image of a general lighting device, and FIG. 6B is a light-emitting image of the lighting device according to the embodiment of the present invention.

As described above, a general light source member does not have a light source at a central portion thereof. Accordingly, as seen in FIG. 6A, the light emitting level of the general light source member is different between the central portion and a peripheral portion of the lighting device, and a dark portion may be formed at the central portion. Accordingly, the general lighting device may have different light uniformity between the central portion and the peripheral portion.

However, as seen in FIG. 6B, the light source member according to the embodiment of the present invention includes the first protrusion protruding from the second opening of the circuit board, and at least one light source is mounted on the first protrusion. That is, since the light source is disposed even on a region corresponding to the first opening of the main body, a luminance of the central portion of the lighting device may also increase. Accordingly, since a difference in luminance between the central portion and the peripheral portion of the lighting device is overcome, a luminance uniformity thereof can be improved.

Figure 7A:
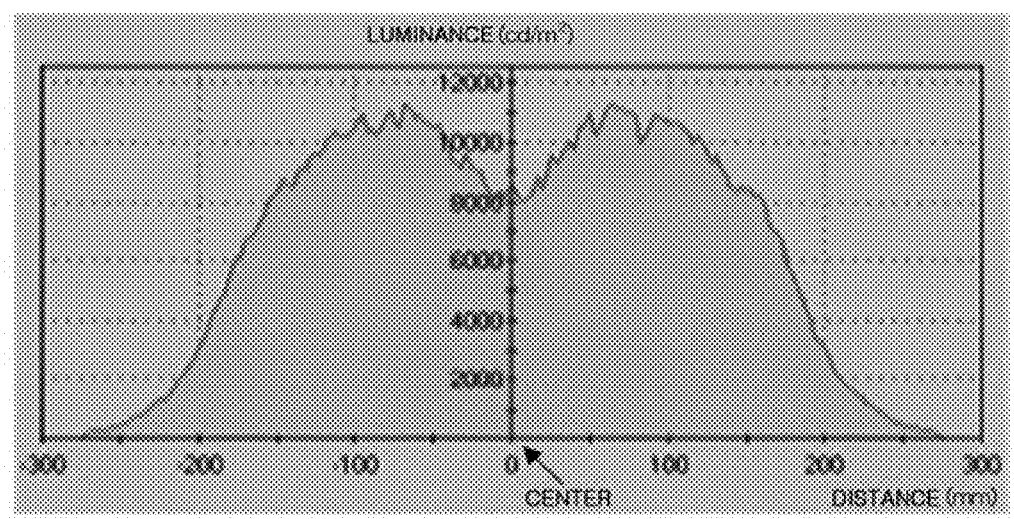
FIG. 7A is a graph showing luminance of FIG. 6A.
Figure 7B:
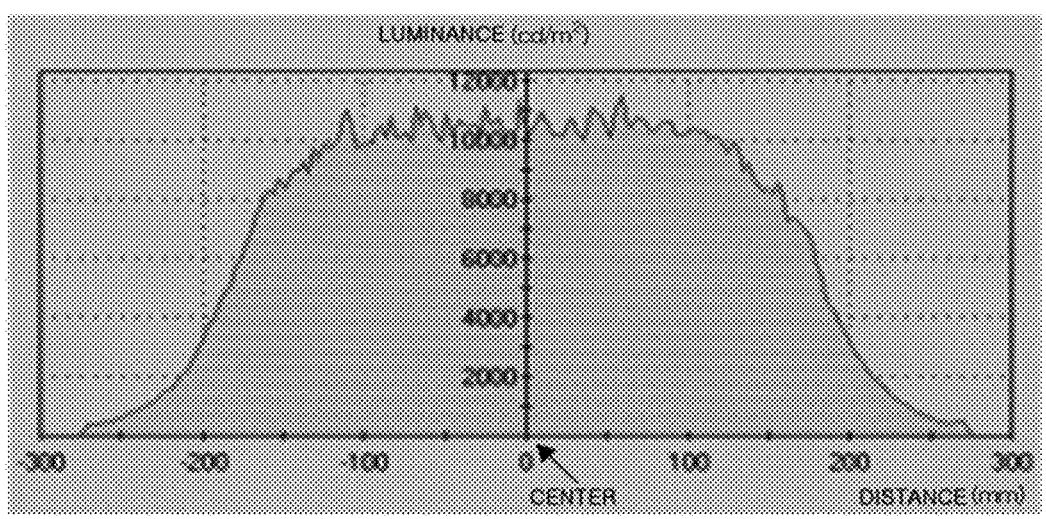
FIG. 7B is a graph showing luminance of FIG. 6B.

FIG. 7A is a graph showing luminance of FIG. 6A, and FIG. 7B is a graph showing luminance of FIG. 6B. Table 1 is a table in which a luminance of the general lighting device is compared with a luminance of the lighting device according to the embodiment of the present invention.

As seen in FIG. 7A, a luminance of a center (a distance is zero) of the general lighting device is much lower than that of a peripheral portion. However, as seen in FIG. 7B, a luminance of a center (a distance is zero) of the lighting device according to the embodiment of the present invention increases so that there are almost no differences in luminance between the central portion and the peripheral portion.

Accordingly, since a luminance of the central portion of the lighting device according to the embodiment of the present invention increases, a luminance of the entire lighting device can increase. As seen in Table 1, in a case in which a luminance of a general lighting device is 100%, a luminance of the lighting device according to the embodiment of the present invention is 114%.

TABLE 1

|  | Lighting Device of FIG. 6A | Lighting Device of FIG. 6B |
| --- | --- | --- |
| Luminance (cd/m$^2$) | 100% | 114% |

As described above, in the lighting device according to the embodiment of the present invention, the light source member includes the circuit board on which at least one light source is mounted at the region overlapping the first opening of the main body. Accordingly, a dark portion of the lighting device is removed so that a luminance uniformity of the lighting device can be improved. In addition, the luminance of the entire lighting device can increase due to the light source disposed on the central portion of the lighting device.

Figure 8:
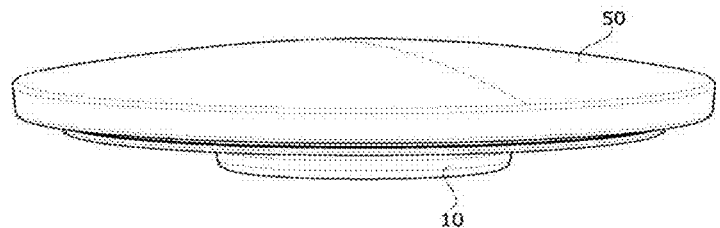
FIG. 8 is a perspective view illustrating a lighting device according to one embodiment of the present.
Figure 9:
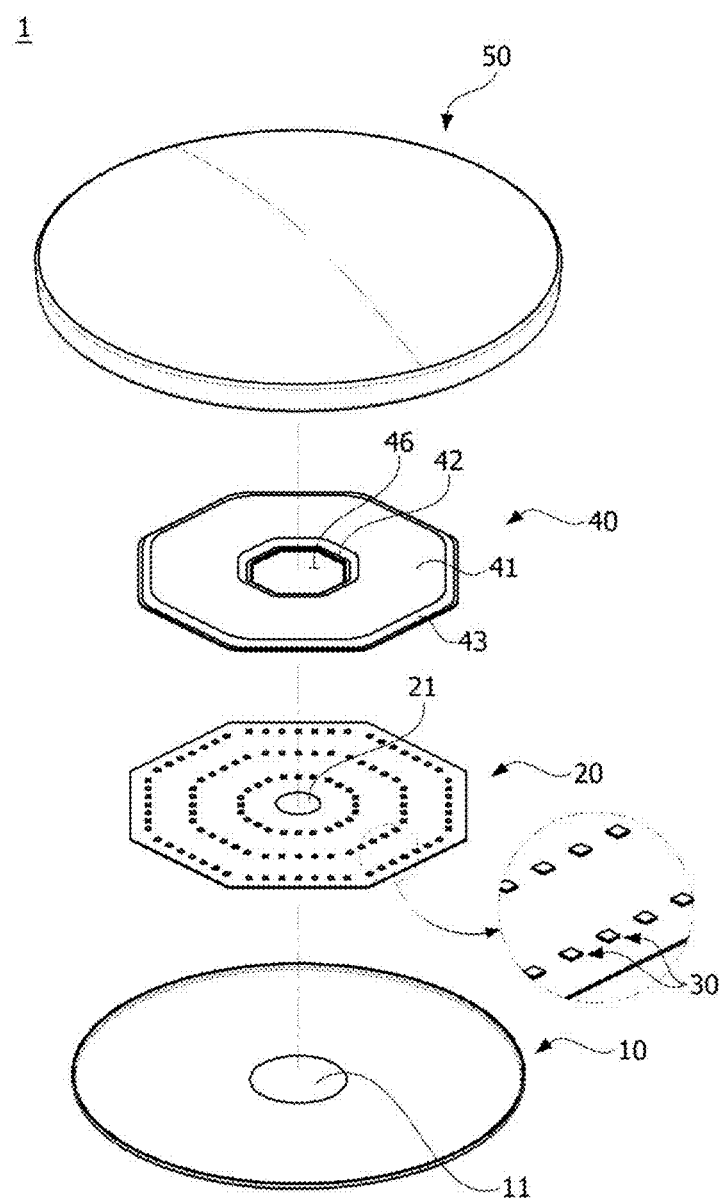
FIG. 9 is an exploded perspective view illustrating the lighting device according to one embodiment of the present invention.
Figure 10:
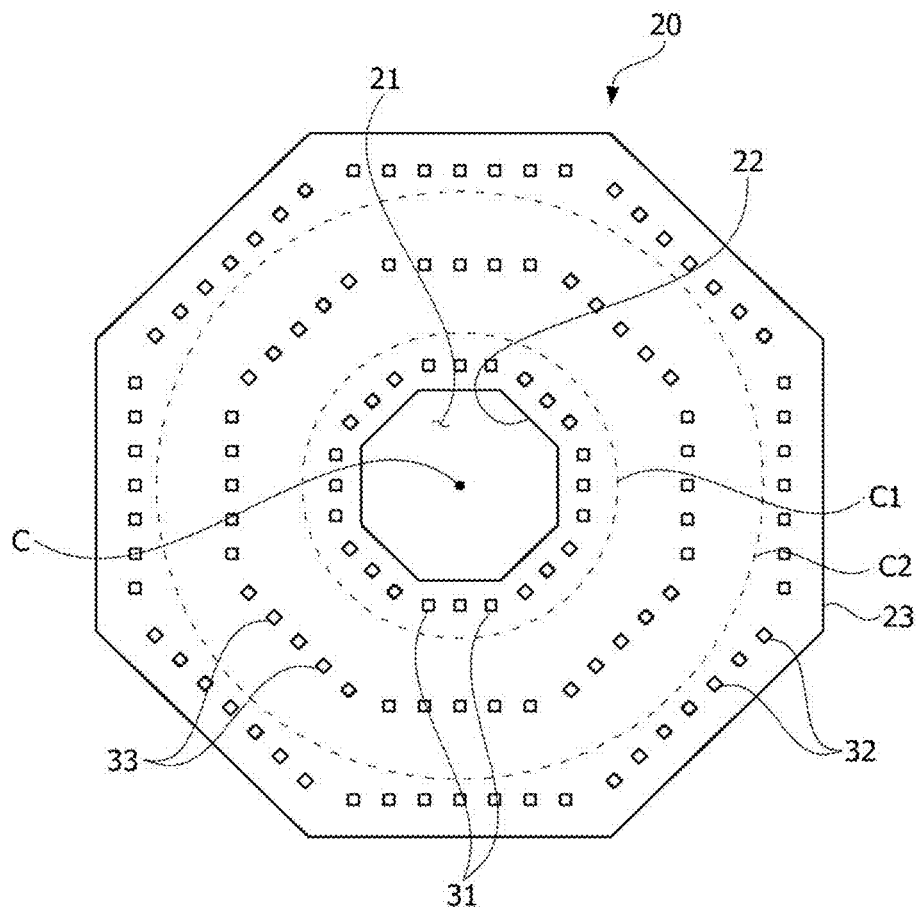
FIG. 10 is a plan view illustrating light-emitting elements disposed on a substrate.

FIG. 8 is a perspective view illustrating a lighting device according to one embodiment of the present, FIG. 9 is an exploded perspective view illustrating the lighting device according to one embodiment of the present invention, and FIG. 10 is a plan view illustrating light-emitting elements disposed on a substrate.

Referring to FIGS. 8 and 9, a lighting device 1 according to the embodiment includes a main body 10, a circuit board 20 disposed on the main body 10, a plurality of light-emitting elements 30 disposed on the circuit board 20, a third cover 40 configured to cover the plurality of light-emitting elements 30, and a first cover 50 coupled to the main body 10.

A shape of the main body 10 may be a circular, oval, or polygonal shape. The shape of the main body 10 is not specifically limited.

An opening 11 may be formed in a central portion of the main body 10. A socket (not shown) may be inserted into the opening 11. Power may be provided to the lighting device through the socket, and the lighting device may also be fixed to a ceiling through the socket. However, the socket may also not be inserted into the main body 10.

The main body 10 may be formed of plastic, and formed through an injection molding process. For example, the main body 10 may be formed of PC. When the main body 10 is formed of the plastic, the main body 10 may be lighter than a main body formed of metal, and manufacturing cost thereof may be reduced. A material of the main body 10 is not limited thereto.

A driver (not shown) configured to drive a light source may be included in the main body 10. A position at which the driver is mounted is not specifically limited.

The driver may include a DC converter configured to convert AC power provided by an external power source into DC power, driving chips configured to control driving of the light source, ESD protection devices for protecting the light source, a receiver module for receiving external signals, and the like.

The circuit board 20 may be disposed on the main body 10. The circuit board 20 may be selected from a PCB, a metal core PCB, a flexible PCB, a ceramic PCB, and the like, but is not limited thereto.

The circuit board 20 may be coated with a material such as silver (Ag) or aluminum (Al), which reflects light, to reflect light, and the material is not limited thereto.

The circuit board 20 may have an oval, circular, or polygonal shape, but is not limited thereto. In the embodiment, the circuit board 20 having an edge in an octagonal shape is illustrated.

The circuit board 20 may be formed as a single board according to the embodiment, or may have a structure in which two or more boards are formed and coupled. A hole 21 may be formed at a center of the circuit board 20, but the circuit board 20 is not limited thereto.

The plurality of light-emitting elements 30 may be disposed on the circuit board 20. Kinds of the light-emitting elements 30 are not limited. The light-emitting element 30 may be an LED configured to emit red, green, or blue light or an LED configured to emit ultraviolet light.

The light-emitting element 30 may be a lateral type, vertical type, or flip-chip type LED, but a structure of the light-emitting element 30 is not specifically limited. The light source member may include the plurality of light-emitting elements 30 disposed on the circuit board 20.

Referring to FIG. 10, the light-emitting elements 30 may include a plurality of first light-emitting elements 31 which surrounds a center C of the circuit board 20 and a plurality of second light-emitting elements 32 which surrounds the plurality of first light-emitting elements 31.

The plurality of first light-emitting elements 31 may be interposed between the center hole 21 and a first virtual circle C1. The plurality of second light-emitting elements 32 may be disposed between a second virtual circle C2 and an edge 23 of the circuit board 20. Here, a center of the center hole 21, a center of the first virtual circle C1, and a center of the second virtual circle C2 may be the same as the center C of the circuit board 20.

The plurality of first light-emitting elements 31 may be innermost light-emitting elements with respect to the center C of the circuit board 20. The plurality of second light-emitting elements 32 may be outermost light-emitting elements with respect to the center C of the circuit board 20. Hereinafter, a direction toward the center C of the substrate is defined as an inward direction, and a direction away from the center C is defined as an outward direction.

A plurality of third light-emitting elements 33 may be interposed between the first virtual circle and the second virtual circle. Three lines on which the light-emitting elements are disposed are illustrated in the drawing, but the number of lines is not limited thereto. Arrangements of the light-emitting elements 30 and the number of lines on which the light-emitting elements 30 are disposed may be suitably adjusted.

For example, the light-emitting elements 30 are disposed in an octagonal shape according to a shape of the substrate, but are not limited thereto. The light-emitting elements 30 may also be disposed in a circular, oval, or polygonal shape.

Referring to FIG. 9, the third cover 40 may be coupled to the circuit board 20 to cover the plurality of light-emitting elements 30. A material of the third cover 40 is not specifically limited as long as the material transmits light. The third cover 40 may have a shape corresponding to that of the circuit board 20.

The third cover 40 includes a light transmitter 41 which faces the light-emitting element 30, a first lens portion 43 connected to an outer side of the light transmitter 41, and a second lens portion 42 connected to an inner side of the light transmitter 41. The light transmitter 41 may have an annular shape in which a first hole 46 is formed at a center thereof.

The first cover 50 is coupled to the main body 10 to accommodate the circuit board 20, the light-emitting elements 30, and the third cover 40. The first cover 50 may diffuse light emitted through the third cover 40. The first cover 50 may form an exterior of the lighting device.

Figure 11:
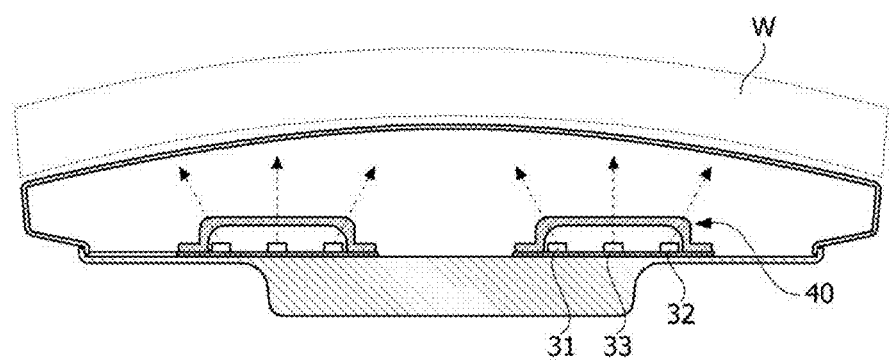
FIG. 11 is a view illustrating the light uniformity of the lighting device according to one embodiment of the present invention.
Figure 12:
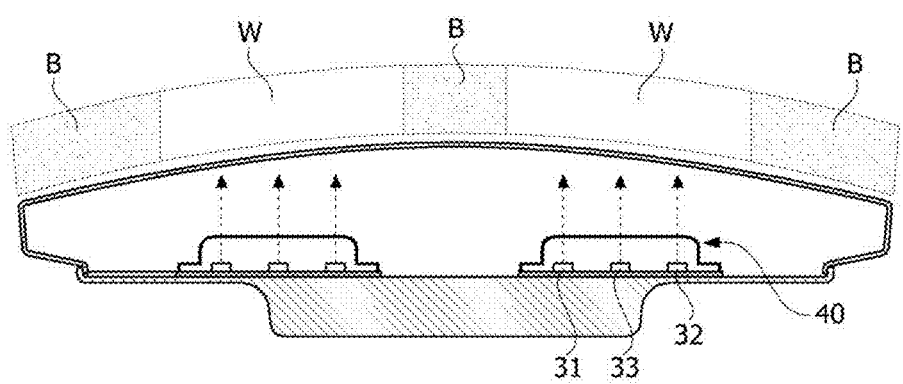
FIG. 12 is a view illustrating the light uniformity of a lighting device of a comparative example.

FIG. 11 is a view illustrating the light uniformity of the lighting device according to one embodiment of the present invention, and FIG. 12 is a view illustrating the light uniformity of a lighting device of a comparative example.

Referring to FIG. 11, light emitted by the first light-emitting elements 31 may diffuse in the inward direction, and light emitted by the second light-emitting elements 32 may diffuse in the outward direction. Accordingly, since light is emitted toward an entire region W including regions in which the first to third light-emitting elements 31, 32, and 33 are disposed, a luminance of the central portion and a luminance of an edge may be improved. That is, an edge portion of the third cover 40 may perform a diffusing lens function.

When the third cover 40 performs a function to simply protect the light-emitting element as illustrated in FIG. 12, since light is emitted toward a region W in which the light-emitting elements 30 are disposed, dark portions B may be formed at the central portion and the edge.

Figure 13:
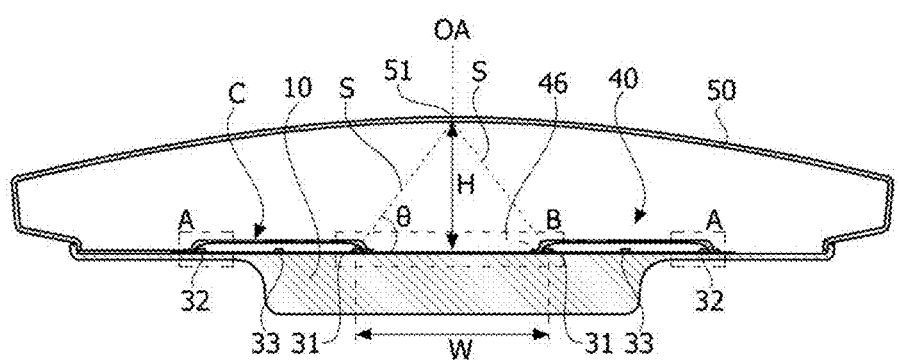
FIG. 13 is a cross-sectional view illustrating the lighting device according to one embodiment of the present invention.
Figure 14:
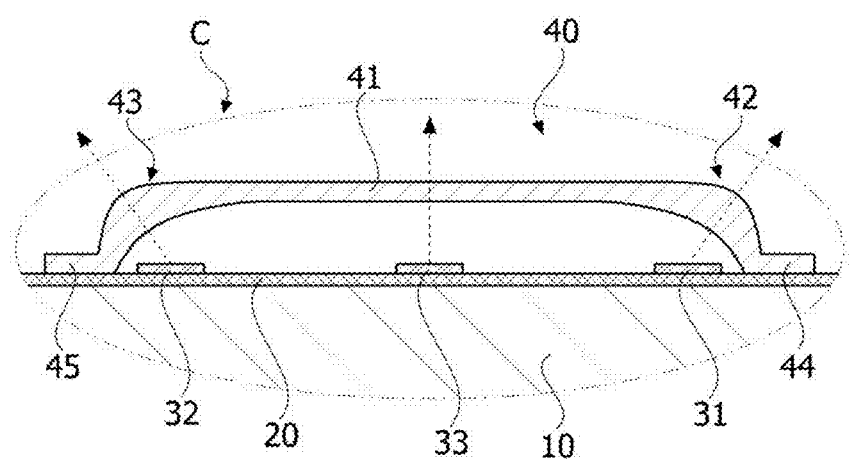
FIG. 14 is an enlarged view illustrating a portion C of FIG. 13.
Figure 15:
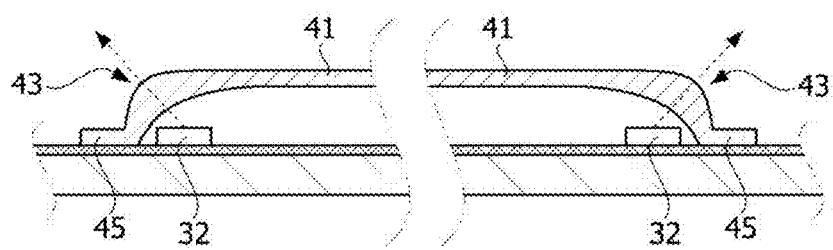
FIG. 15 is an enlarged view illustrating a portion A of FIG. 13.
Figure 16:
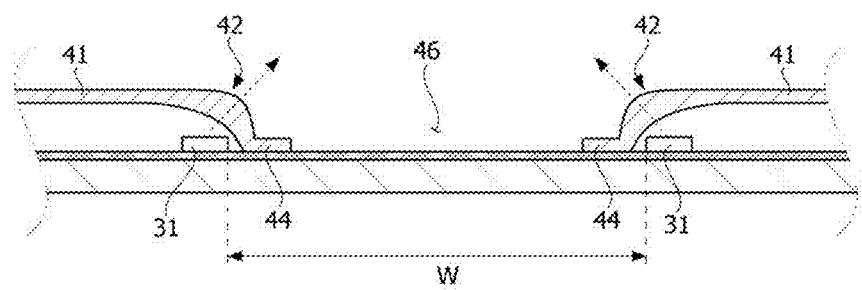
FIG. 16 is an enlarged view illustrating a portion B of FIG. 13.

FIG. 13 is a cross-sectional view illustrating the lighting device according to one embodiment of the present invention, FIG. 14 is an enlarged view illustrating a portion C of FIG. 13, FIG. 15 is an enlarged view illustrating a portion A of FIG. 13, and FIG. 16 is an enlarged view illustrating a portion B of FIG. 13.

Referring to FIGS. 13 and 14, the third cover 40 may include the light transmitter 41 which faces the light-emitting elements 30, the second lens portion 42 connected to the inner side of the light transmitter 41, the first lens portion 43 disposed to the outer side of the light transmitter 41, a first fixing portion 45 which couples the first lens portion 43 to the substrate, and a second fixing portion 44 which couples the second lens portion 42 to the circuit board 20.

The light transmitter 41 may have an annular shape in which the first hole 46 is formed at the center thereof. However, the light transmitter 41 is not specifically limited thereto, and may have an overall dome shape. Hereinafter, the light transmitter 41 having the annular shape will be described.

The second lens portion 42 may diffuse light emitted by the first light-emitting elements 31 in the inward direction. A thickness of the second lens portion 42 may be adjusted to diffuse incident light. The thickness of the second lens portion 42 may be greater than that of the light transmitter 41. That is, the second lens portion 42 may have a diffusion function. For example, the second lens portion 42 may be a diffusion lens. However, the second lens portion 42 is not limited thereto, and a diffusion film may also be attached thereto, or diffusion particles may also be dispersed thereon.

The first lens portion 43 may diffuse light emitted from the second light-emitting elements 32 in the outward direction. For example, a thickness of the first lens portion 43 may be adjusted to diffuse incident light. The thickness of the first lens portion 43 may be greater than that of the light transmitter 41. That is, the first lens portion 43 may have a diffusion function. For example, the first lens portion 43 may be a diffusion lens. However, the first lens portion 43 is not limited thereto, and a diffusion film may also be attached thereto, or diffusion particles may also be dispersed thereon.

The second lens portion 42 and the first lens portion 43 may be symmetrical with respect to an optic axis of the third light-emitting element 33. That is, the first lens portion 43 and the second lens portion 42 may be lenses having the same shape. However, the first lens portion 43 and the second lens portion 42 may also have different shapes.

In a case in which the first lens portion 43 and the second lens portion 42 do not perform the diffusion functions, a light source has to be additionally disposed to remove dark portions generated at the central portion and the edge of the lighting device. For example, a light source may be additionally disposed at a center of the substrate to remove the dark portion generated at the central portion of the lighting device. However, since the first lens portion 43 and the second lens portion 42 according to the embodiment diffuse light, the number of light-emitting elements can be reduced.

According to the embodiment, since only a shape of the first lens portion 43 is controlled to increase a luminance of the edge as illustrated in FIG. 15, and only a shape of the second lens portion 42 is controlled to increase a luminance of the central portion as illustrated in FIG. 16, the cover is easily manufactured. That is, in a case in which the number of the light-emitting elements increases so that the cover is enlarged, the cover is easily manufactured because the shapes of both the first and second lens portions 42 and 43 have to be considered.

For example, in a case in which lenses corresponding to the light-emitting elements are formed on a cover, since the lenses have to be formed to exactly match with light-emitting elements, there is a problem in that a manufacturing cost increases.

Figure 17:
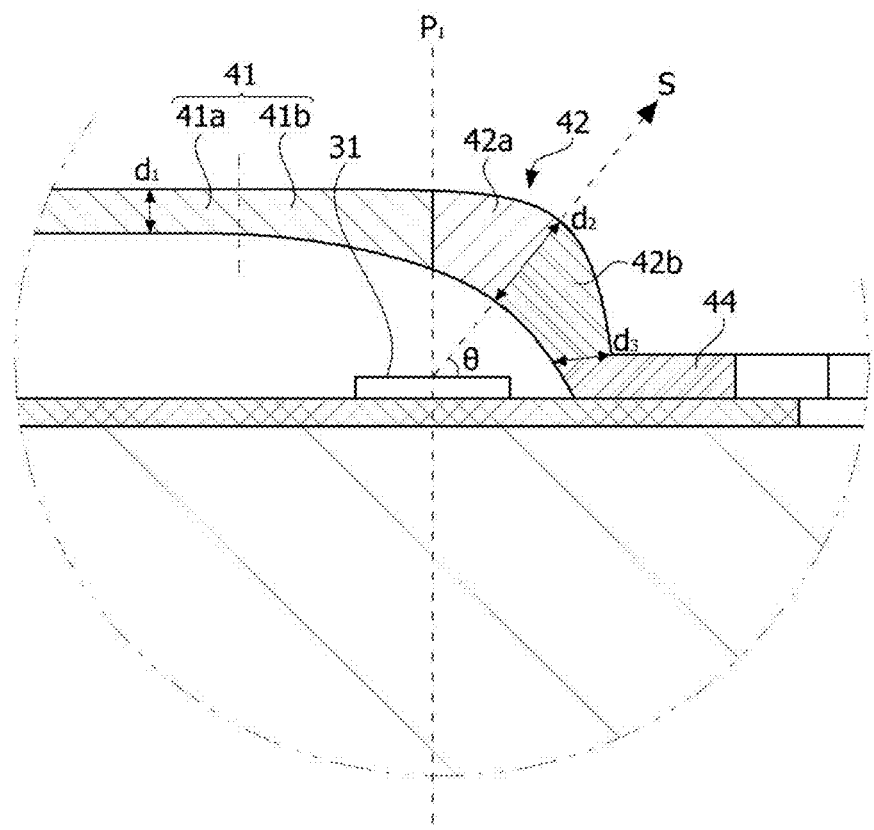
FIG. 17 is a view illustrating a structure of an edge portion.
Figure 18:
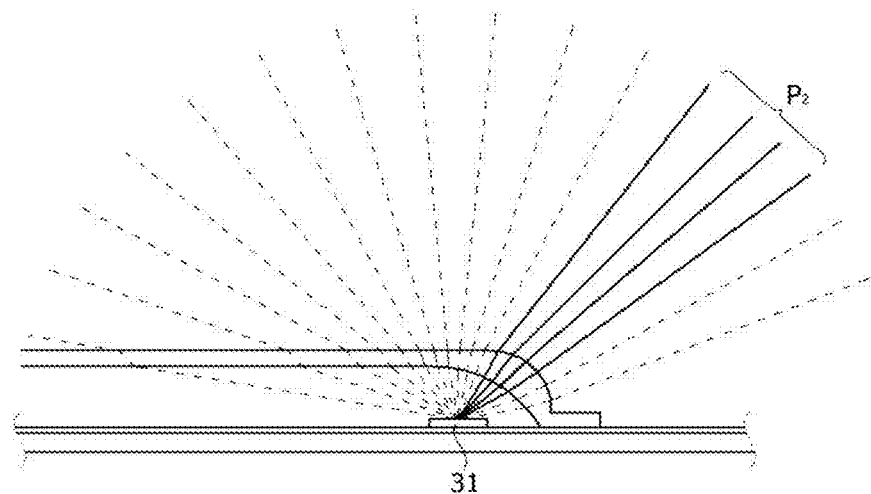
FIG. 18 is a view illustrating a state in which light is diffused by the edge portion.
Figure 19:
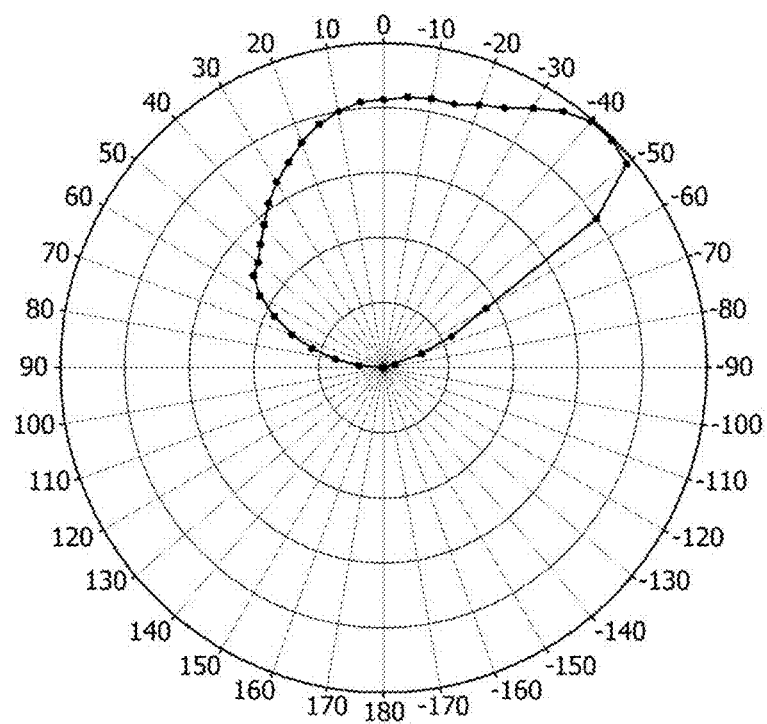
FIG. 19 is a graph showing the intensity of light emitted by a lighting device.

FIG. 17 is a view illustrating a structure of an edge portion, FIG. 18 is a view illustrating a state in which light is diffused by the edge portion, and FIG. 19 is a graph showing the intensity of light emitted by a lighting device.

Referring to FIG. 17, the second lens portion 42 may include a first region 42a in which a thickness thereof increases away from the light transmitter 41, and a second region 42b in which a thickness thereof decreases away from the first region 42a. An interface between the light transmitter 41 and the first region 42a may be an optical axis P1 perpendicular to a center of the first light-emitting element 31.

The light transmitter 41 may include a first light transmission region 41a which has a predetermined thickness d1 and is flat, and a connecting portion 41b which connects the first light transmission region 41a to the first region 42a. The thickness of the connecting portion 41b may increase as the connecting portion 41b increases away from the first light transmission region 41a.

Hereinafter, a structure of the second lens portion 42 will be described as a base, but the structure of the second lens portion 42 may be the same as that of the first lens portion 43.

A thickness d2 at an interface between the first region 42a and the second region 42b may be greater than the thickness d1 of the light transmitter 41. A thickness ratio d2:d1 between the thickness d2 of the interface between the first region 42a and the second region 42b and the thickness d1 of the light transmitter 41 may be 2:1 to 3:1.

A thickness of the edge portion may be most thick at the interface between the first region 42a and the second region 42b. Here, a virtual line S extending from the interface region may have an angle θ in the range of 33° to 55° with respect to an upper surface of the first light-emitting element 31. In a case in which the angle θ meets the range of angle, dark portions generated at a center and the edge of the lighting device may be effectively removed. To improve a diffusion effect, an external surface of the edge portion may have an irregular shape.

As the second fixing portion 44 is coupled to the circuit board 20 by a screw or the like, the third cover 40 may be fixed to the circuit board 20. A thickness d3 at an interface between the second lens portion 42 and the second fixing portion 44 may be greater than the thickness dl of the first light transmission region 41a.

Referring to FIGS. 18 and 19, a pattern of beams emitted from the first light-emitting element 31 has a shape in which the beams have a maximum intensity at 35° to 55° in a direction in which the thickness of the edge portion increases, and the intensity gradually decreases from the maximum intensity.

That is, it may be seen that a majority of light emitted from the first light-emitting element 31 is refracted and/or diffused toward an inside of the cover by the second lens portion 42.

Referring to FIGS. 13 and 17, the virtual line S extending from the interface between the first region 42a and the second region 42b and a height of the first cover 50 may satisfy following interaction formula.

$$0.8\ (2H/W) < \tan \theta < 1.2\ (2H/W)$$ Formula 1

Here, θ is an angle between the virtual line S and the upper surface of the light-emitting element, H is the height of the first cover 50, and W is a distance between the centers of the first light-emitting elements 31. The virtual line S extending from the interface may intersect with a virtual axis OA which connects centers of the substrate and the first cover 50. For example, the virtual line S may intersect at a center 51 of the first cover 50.

In a case in which the angle θ of the virtual line S extending from the interface between the first region 42a and the second region 42b satisfies the range, light is uniformly dispersed on an entire light-emitting surface of the lighting device, and thus light uniformity can be improved.

However, in a case in which the angle θ of the virtual line S is less than 0.8 (2H/W) or greater than 1.2 (2H/W), light may not sufficiently diffuse toward the central portion and the edge of the lighting device, and bright lines or dark portions may be generated.

Figure 20:
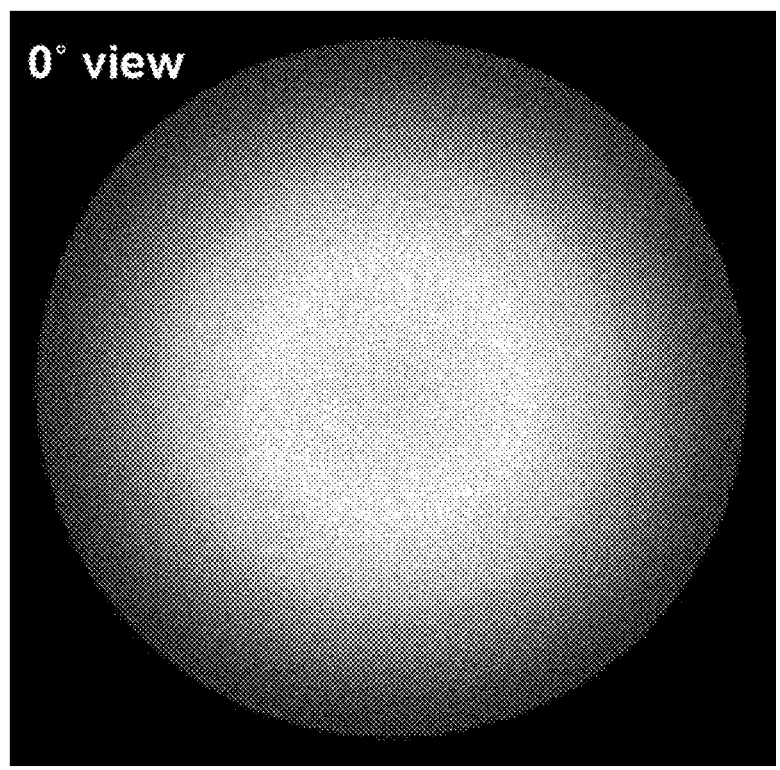
FIG. 20 is a light-emitting image of the lighting device according to one embodiment of the present invention.
Figure 21:
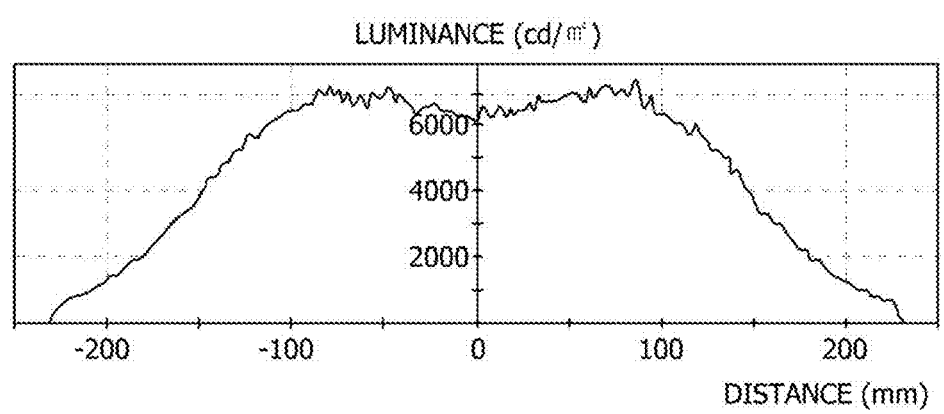
FIG. 21 is a graph showing luminance of FIG. 20.
Figure 22:
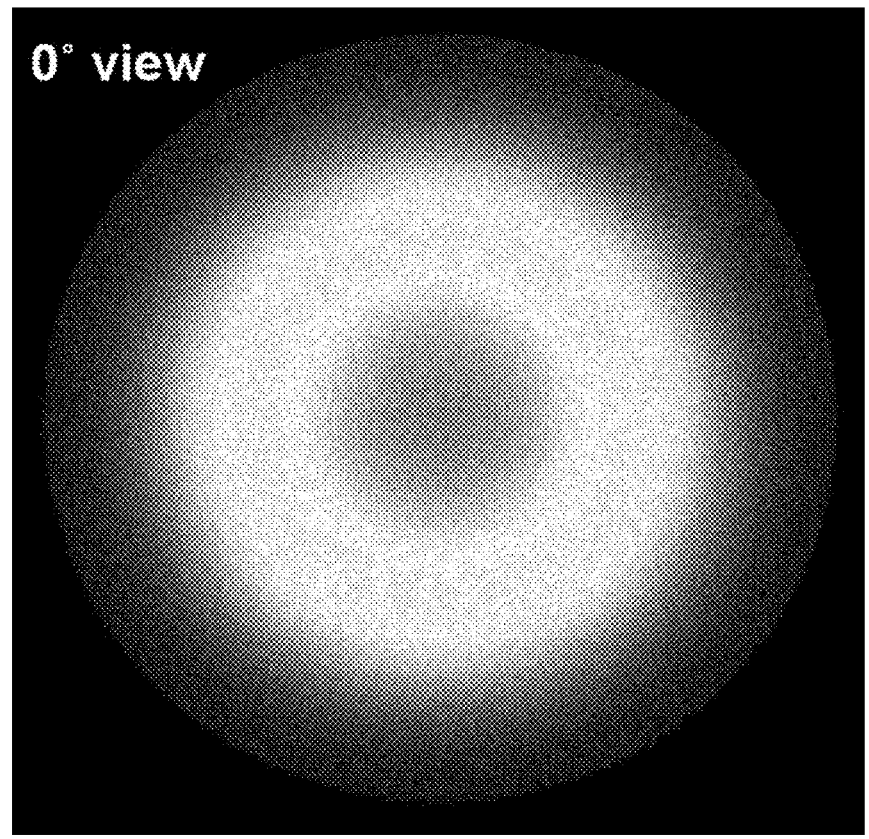
FIG. 22 is a light-emitting image of a general lighting device.
Figure 23:
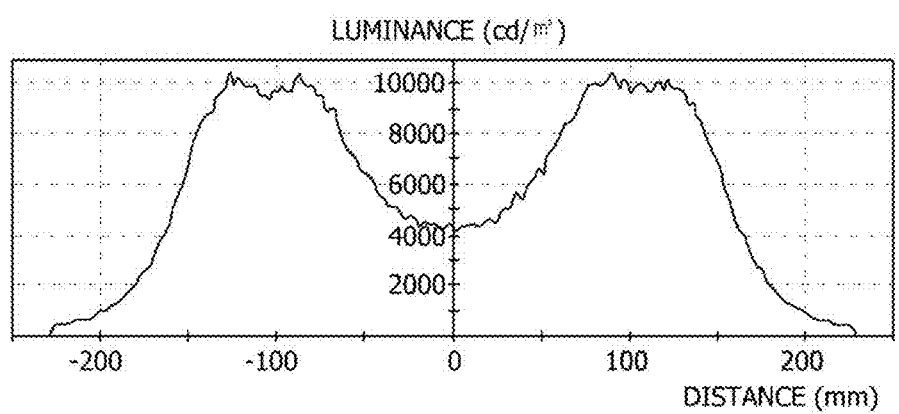
FIG. 23 is a graph showing luminance of FIG. 22.

FIG. 20 is a light-emitting image of the lighting device according to one embodiment of the present invention, FIG. 21 is a graph showing luminance of FIG. 20, FIG. 22 is a light-emitting image of a general lighting device, and FIG. 23 is a graph showing luminance of FIG. 22.

Referring to FIG. 20, in the lighting device according to the embodiment, it may be seen that light emitted from the light-emitting elements 30 diffuses to increase a luminance of the central portion and a luminance of the edge. Referring to FIG. 21, it may be seen that the luminance of the central portion (a distance is zero) is about 6000 cd/m$^2$, and there are no big differences in luminance compared with peripherals. Accordingly, it may be seen that a dark portion of the central portion is removed.

However, referring to FIGS. 22 and 23, a luminance of a peripheral portion of a general lighting device is about 10000 cd/m$^2$, but a luminance of a central portion thereof (a distance is zero) is about 4000 cd/m$^2$, and it may be seen that there is a big difference in light emitting level. Accordingly, a dark portion may be generated at the central portion.

According to the embodiment, the luminance of the edge can increase due to the first lens portion 43, and the luminance of the central portion can increase due to the second lens portion 42. Accordingly, an overall light uniformity of the lighting device can be improved.

The above-described embodiments of the present invention are not limited to the above-described embodiments and the accompanying drawings, and it will be clear to those skilled in the art in which the embodiments of the present invention pertain that various substitutions, modifications, and changes may be made without departing from the technical spirit of the embodiments.

The invention claimed is:

1. A lighting device comprising:
a main body including a first opening at a center;
a light source member including a circuit board disposed on the main body and a plurality of light-emitting elements disposed on the circuit board;
a main cover disposed above the light source member and coupled to the main body; and
a third cover interposed between the light source member and the main cover,
wherein the circuit board includes at least one second opening which vertically overlaps the first opening and one or more first protrusions which protrudes from a side surface of the second opening toward an inside of the second opening, and
at least one light-emitting element is mounted on the first protrusion;
wherein the third cover includes:
a light transmitter which faces the plurality of light-emitting elements, and includes a first hole formed at a center of the light transmitter;
a first lens portion disposed on an outer side of the light transmitter;
a second lens portion disposed on an inner side of the light transmitter; and
a first fixing portion which fixes the first lens portion to the circuit board,
the light transmitter includes a first light transmission region disposed above the plurality of light-emitting elements and a connecting portion which connects the first light transmission region and the first lens portion,
the first light transmission region is a flat region having a constant thickness, and
a thickness of the first lens portion is greater than a thickness of the first light transmission region,
the second lens portion includes a first region in which a thickness increases away from the light transmitter, and a second region in which a thickness decreases away from the first region of the second lens portion;
an interface between the first region and the second region of the second lens portion has a predetermined angle with respect to an upper surface of a first light-emitting element; and
the first light-emitting element is a light-emitting element disposed to be closest to a center of the circuit board, and
wherein the predetermined angle has a range of 33° to 55°.

2. The lighting device of claim 1, wherein:
an end of the first protrusion extends from one side surface of the second opening to the other side surface of the second opening; and
the first protrusion connects the side surfaces, which face each other, of the second opening.

3. The lighting device of claim 1, wherein two first protrusions which are identical to the first protrusion protrude from both side surfaces of the second opening toward the inside of the second opening, and face each other in the second opening.

4. The lighting device of claim 1, further comprising a socket disposed in the first opening,
wherein the socket is coupled to the main body and vertically overlaps the first protrusion.

5. The lighting device of claim 1, wherein the third cover includes a second protrusion which protrudes to vertically overlap the first protrusion.

6. The lighting device of claim 1, further comprising a supporting member interposed between the main body and the light source member,
wherein the supporting member includes a third protrusion which protrudes to vertically overlap the first protrusion.

7. The lighting device of claim 1, further comprising:
a driver interposed between the main body and the light source member; and
a receiver configured to wirelessly receive an external signal, wherein
the driver is accommodated in the main body, and
the receiver is exposed from an upper surface of the light source member.

8. The lighting device of claim 1, wherein the third cover includes a second fixing portion that fixes the second lens portion to the circuit board.

* * * * *